United States Patent [19]

Zavracky

[11] Patent Number: 4,940,672
[45] Date of Patent: Jul. 10, 1990

[54] METHOD OF MAKING MONOLITHIC INTEGRATED III-V TYPE LASER DEVICES AND SILICON DEVICES ON SILICON

[75] Inventor: Paul M. Zavracky, Norwood, Mass.

[73] Assignee: Kopin Corporation, Taunton, Mass.

[21] Appl. No.: 325,242

[22] Filed: Mar. 17, 1989

[51] Int. Cl.[5] .................... H01L 21/20; H01L 21/203
[52] U.S. Cl. ........................... 437/132; 148/DIG. 26; 148/DIG. 72; 148/DIG. 95; 156/645; 156/662; 357/17; 372/50; 437/89; 437/129
[58] Field of Search .................. 148/DIG. 25, 26, 50, 148/51, 56, 65, 72, 95, 97, 110, 169; 156/610-614, 643, 645, 662; 357/16, 17, 55, 56; 372/43, 45, 46, 50; 437/51, 54, 59, 81, 105, 107, 111, 108, 126, 129, 89, 90, 132, 133, 936, 976

[56] References Cited

U.S. PATENT DOCUMENTS

| | | | |
|---|---|---|---|
| 4,551,394 | 11/1985 | Betsch et al. | 437/129 |
| 4,608,696 | 8/1986 | Law et al. | 372/50 |
| 4,719,498 | 1/1988 | Wada et al. | 372/50 |
| 4,764,246 | 8/1988 | Bridges et al. | 156/662 |
| 4,769,342 | 9/1988 | Yagi et al. | 437/90 |
| 4,774,205 | 9/1988 | Choi et al. | 437/59 |
| 4,777,148 | 10/1988 | Liau et al. | 437/129 |
| 4,777,516 | 10/1988 | Deschler et al. | 357/17 |
| 4,826,784 | 5/1989 | Salerno et al. | 437/89 |

FOREIGN PATENT DOCUMENTS

| | | | |
|---|---|---|---|
| 0044769 | 3/1983 | Japan | 437/129 |
| 0051585 | 3/1984 | Japan | 372/50 |
| 0045082 | 3/1985 | Japan | 372/50 |
| 0193393 | 10/1985 | Japan | 372/50 |
| 0270883 | 12/1986 | Japan | 372/50 |
| 0056955 | 3/1988 | Japan | 372/50 |

OTHER PUBLICATIONS

Ghash et al., "Monolithic Integration of GaAs . . . and Si Metal-Oxide-Semiconductor Field-Effect Transistors", Appl. Phys. Lett., 48(5), Feb. 3, 1986, pp. 370-371.

*Primary Examiner*—Brian E. Hearn
*Assistant Examiner*—William Bunch
*Attorney, Agent, or Firm*—Hamilton, Brook, Smith & Reynolds

[57] ABSTRACT

A monolithic integrated structure in which a compound semiconductor (III–V or II–VI material) optoelectronic device (laser) is formed in the shape of a mesa-like structure projecting from an etch pit in an Si substrate. A method for sonically removing cantilevered beams formed on said optoelectronic device, to provide laser end facets, is also described.

27 Claims, 4 Drawing Sheets

90° ROTATED VIEW WITH TOTAL NITRIDE ENCAPSULATION

NITRIDE CUT & ANISOTROPIC ETCH

CLEAVE

NITRIDE DEP. & CUT

SELECTIVE EPI DEPOSITION

POLY PATTERN & ETCH

OXIDE DEP. & CUT

METAL DEP. & PATTERN

90° ROTATED VIEW WITH TOTAL NITRIDE ENCAPSULATION

NITRIDE CUT & ANISOTROPIC ETCH

CLEAVE

CONTACT CUT

METHOD OF MAKING MONOLITHIC INTEGRATED III-V TYPE LASER DEVICES AND SILICON DEVICES ON SILICON

BACKGROUND OF THE INVENTION

The demands on communications systems are increasing at a tremendous rate. Reliable date transfer at the rates required for applications such as signal processing necessitate the use of optical communications. As these systems become sufficiently complex, the use of optoelectronic integrated circuits (OEIC) is becoming increasingly attractive for cost and performance reasons. In the last several years, significant efforts have been made toward the monolithic integration of optical and electronic devices formed of III-V compounds and alloys thereof to take advantage of the superior optical properties of III-V compounds over conventional silicon material. In particular, GaAs electronic and GaAs/GaAlAs optical devices on GaAs wafers have received considerable attention. These efforts to date have been successful from the standpoint of preliminary concept demonstration but have been limited by the immaturity of GaAs electronic device technology and the quality of the GaAs material itself. Recent progress in obtaining high-quality GaAs on Si substrates offers the potential to overcome these obstacles. The key advantage of GaAs on Si for integrated optoelectronic components is that the electronic circuits can be fabricated in Si wafers. The design and fabrication technology of Si circuits is well developed and the economics of such circuits is very attractive. This approach to monolithic GaAs and Si integration will complement Si electronic circuits with GaAs/GaAlAs optical components.

The essence of monolithic integration technology is not only the ability to grow high-quality GaAs on Si substrates but also the ability to fabricate GaAs and Si devices together on a single chip. The ability to grow high quality GaAs layers on Si substrates has been demonstrated by several groups. The fabrication of GaAs and Si devices together on one chip has also been demonstrated.

Full monolithic integration of interconnected GaAs/GaAlAs double heterostructure Light Emitting Diodes (LEDs) and Si MOSFETs has also been demonstrated (see co-pending U.S. Pat. No. 4,774,205 issued Sept. 27, 1988 to H.K. Choi et al.)

Despite the above, much work remains before full scale commercialization of these approaches can be realized. One of the remaining problems is to find a convenient and reliable method and apparatus for coupling the light to and from the optical devices. In conventional non-integrated structures light is coupled from the lasers via optical fibers aligned with the active laser emitting edge of the optical device. Such alignment is a difficult labor intensive exercise, which if improperly performed, can result in damage to the laser device, or the fiber, or both.

SUMMARY OF THE INVENTION

The present invention relates, in general, to a method for fabricating compound semiconductor optical devices, preferably of III-V material, or alloys thereof, but also II-VI material and silicon electronic devices on an Si substrate in a monolithic integrated fashion. The III-V material of choice is GaAs or an aluminum alloy thereof. The invention also includes provisions in the process steps whereby the optical device is constructed in the form of a pedestal, or mesa, rising above the Si substrate to facilitate fiberoptic coupling to or from the optical device on the chip or wafer, to other devices or other chips.

The method of the invention comprises, in general, the following:

1. A Si wafer is processed to include appropriate Si electronic device(s) on an upper surface, along with regions of doped silicon for effecting good contact to the optoelectronic devices. Before contact metallization is applied to the Si device(s), the processed wafer is encapsulated with a protective coating, e.g., $Si_3N_4$, or $SiO_2$, or both.

2. Optoelectronic III-V or II-VI type semiconductor devices are formed through openings in the protective coating.

3. Openings are made through the protection coating to the Si electronic device and the ohmic contact regions and contact metallization is formed in the openings.

4. The silicon underlying the optoelectronic devices is anisotropically removed, as by preferential etching, leaving the optoelectronic devices isolated above the etched Si substrate surface in the form of a mesa or pedestal. Portions of this mesa, or pedestal, are undercut by the etchant, leaving cantilevered, or overhanging beams of material on each side of the pedestal. By suitable selection of the crystalline orientation of the Si wafer, the preferential etching will occur rapidly along all faces except the <111> face of the Si substrate underlying the ends of the optoelectronic device. This results in an etch groove with side walls formed along the <111> faces of the silicon crystal. These <111> planes intersect the surface of the wafer along a line parallel to the [110] direction. When the optoelectronic device is grown on the wafer surface, a <110> plane of the device is aligned to this [110] direction. Therefore, the cleavage plane <110> of the cantilevered portions is aligned with the edge of the etchant pit.

In a preferred embodiment, the optoelectronic device is a GaAs/AlGaAs semiconductor edge-emitting laser and the end facets for the laser are formed by cleaving the cantilevered beam using sonic energy tuned to the predetermined resonant frequency of the cantilevered beam.

The above and other features of the invention will now be described in connection with the drawings.

DETAILED DESCRIPTION OF THE INVENTION

The invention will now be described in detail in connection with the drawings and the preferred GaAs/-

GaAlAs laser structure; it being understood that other III/V or II/VI materials are contemplated.

Figure 1A:
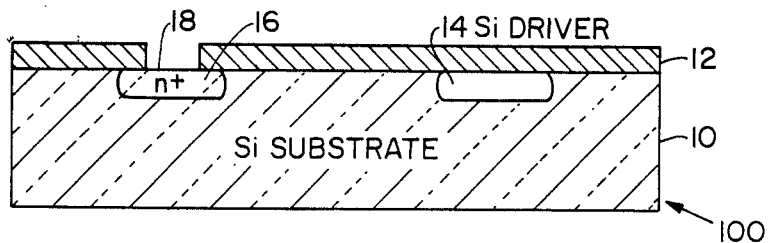
FIGS. 1a–1h is a schematic sectional process flow diagram of the invention.

As shown in FIG. 1a, the first step in the process begins with providing wafers 100 which have been processed at a silicon foundry to include the desired silicon circuits such as Si driver circuit 14 already formed in an Si substrate 10, using well established Si bipolar, MOSFET or MESFET techniques. These wafers are off-orientation <100> wafers. The wafers 10 are processed up to metal deposition. Instead of depositing the metal, the entire wafer surface is covered with a high quality mask or protective layer 12, preferably of silicon nitride, although other materials, such as $SiO_2$, $Al_2O_3$, or a combination of each is contemplated. The material 12 may be deposited by well-known techniques, such as CVD, LPCVD, PECVD, etc.

The layer 12 is then etched, preferably using a plasma etch technique, to open holes 18 for selective GaAs/AlGaAs epitaxial deposition. The silicon beneath these holes has been previously heavily doped at the foundry with an n-type dopant forming a good ground contact region 16 for a lower laser electrode to be formed thereon.

A GaAs/AlGaAs laser structure, shown generally at 22, is then selectively deposited in the nitride windows. Away from the windows and on the nitride itself, the GaAs layer 20 is polycrystalline. This material is selectively removed by etching using a $H_2O/H_2O_2/NaOH$ solution or other well-known solution, which preferentially etches poly-GaAs, leaving intact the single crystal GaAs or AlGaAs layers 22 that are deposited on the n+silicon region 16.

One method for achieving such selective deposition is described in co-pending U.S. Application Ser. No. 07/120,021 filed Nov. 13 1987, entitled "Optoelectronic Interconnections for III-V Devices on Silicon" (Attorney Docket No. KPN87-09) and involves organometallic chemical vapor deposition (OMCVD) or molecular beam epitaxy (MBE) deposition. Alternately, the nitride layer can be avoided and selective epitaxial GaAs deposition can be made by OMCVD directly on the exposed n+ region 16 of the Si surface using an $SiO_2$ mask and the techniques described in co-pending U.S. Application Ser. No. 07/120,018 filed Nov. 13, 1987, entitled "Selective OMCVD Growth of Compound Semiconductor Materials on Silicon Substrates" (Attorney Docket No. KPN87-10). Another technique using MBE is described in U.S. Pat. No. 4,774,205 entitled "Monolithic Integration of Silicon and Gallium Arsenide Devices" issued Sept. 27, 1988 to H.K. Choi et al.

Figure 1B:
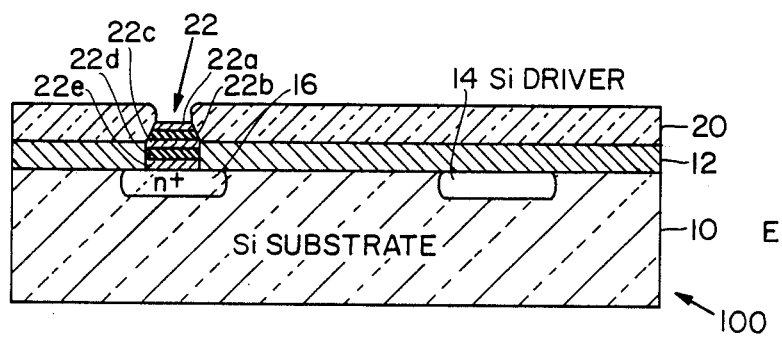
Figure 1C:
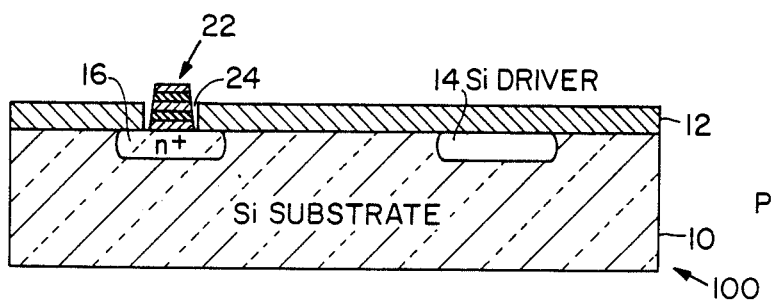

Photoresist (not shown) is then applied to the wafers 100 and they are exposed to a mask which defines the area that will become the region upon which the GaAs/AlGaAs device is grown. This area is intentionally made smaller than the original nitride window 18, to insure that only the best quality GaAs is used for the laser. Both the polycrystalline layer 20 and some of the crystalline GaAs/AlGaAs 22 is etched away at 24 to create the laser mesas 22 [See FIG. 1(c)].

The GaAs/AlGaAs laser heterostructure 22 may comprise a series of thin films forming a first contact layer 22e of AlGaAs, a bottom waveguide region of AlGaAs cladding material 22d and an active lasing layer 22c of undoped GaAs. A top cladding layer of AlGaAs 22b is then formed on the active region, followed by a top contact layer of AlGaAs 22a [See FIG. 1(b)].

Figure 1D:
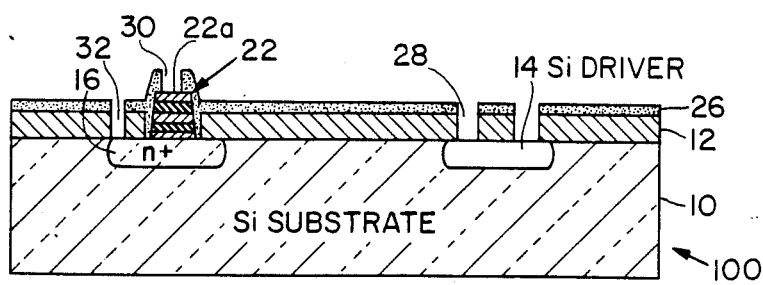

The wafers 100 are then coated with a CVD oxide 26, i.e., $SiO_2$ or other suitable dielectric material. This material must be capable of supporting the electric fields encountered during the operation of the device. Therefore. depending on the quality of the oxide, the thickness is adjusted appropriately. After deposition, the wafer 100 is again photolithographically patterned and the oxide 26 is removed by etching to create contact holes 32, 30 and 28, through which the subsequent metallization will be able to contact the respective silicon n+ layer 16, the GaAlAs p+ contact layer 22a and the Si driver circuit 14 [See FIG. 1(d)].

Figure 1E:
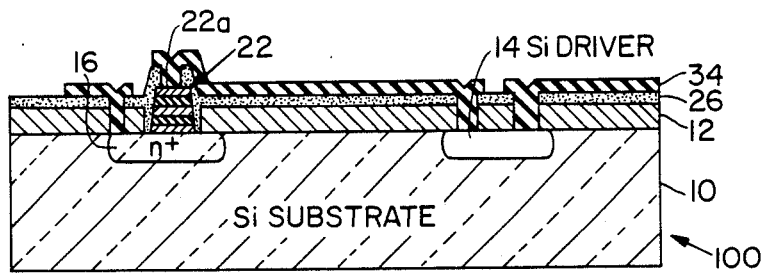

With contact windows cut, the metal interconnection layer 34 is deposited, patterned and etched. Preferably, aluminum is used to make an ohmic contact to both the n+ silicon 16 and to the p+ GaAlAs layer 22a. The interconnection is made to connect the Si driver circuit 14 to the laser 22, so that current from the Si device can be used to energize the laser 22. Obviously, other metal patterns (not shown) can be formed to bring in biasing voltage and to make other interconnections, as required. Both contacts can be sintered at the same temperature of about 450° C [See FIG. 1(e)].

Figure 1F:
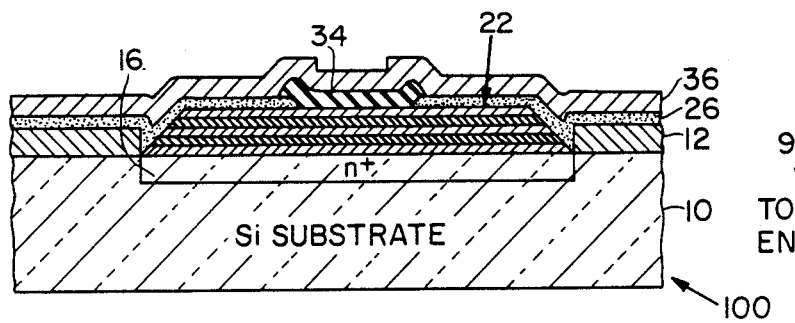
Figure 1G:
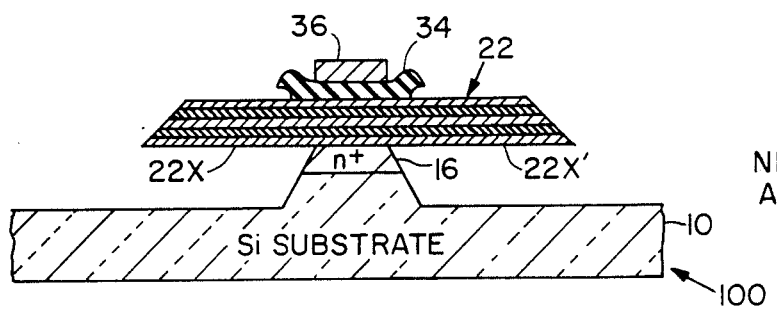
Figure 3:
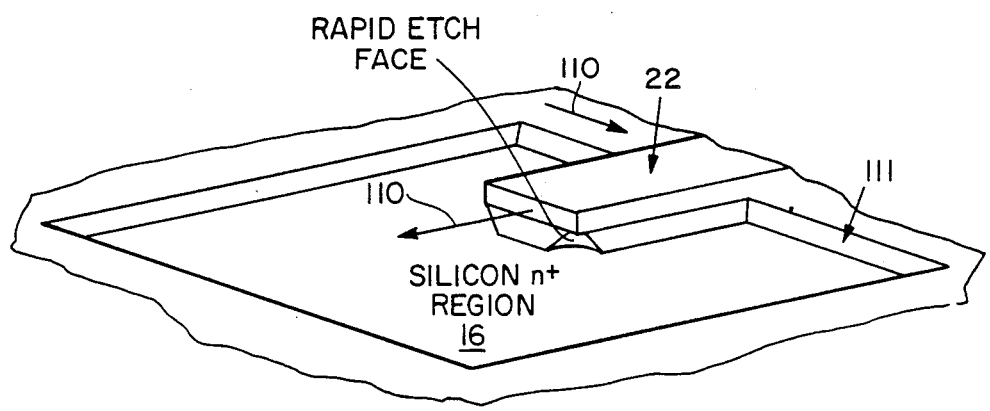
FIG. 3 is a perspective view illustrating the crystalline orientation of the wafer for proper preferential etching.
Figure 4:
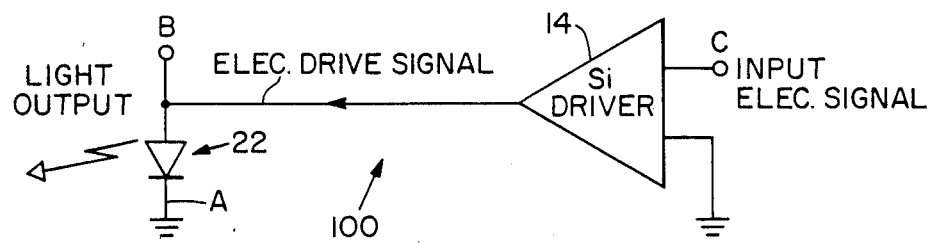
FIG. 4 is an electrical schematic of the finished chip 100.

The entire wafer is next coated with a second mask layer 36, such as CVD deposited $Si_3N_4$ [FIG. 1(f)]. FIG. 1(f) shows the same structure as in FIG. 1(e), but rotated by 90°. The laser 22 is therefore seen in cross-section as viewed from its side rather than end-on. Layer 36 is selected to be chemically resistant to conventional silicon anisotropic etchants. Windows are opened in layer 36 such that the anisotropic etchant, i.e., heated KOH or heated hydrazine and $H_2O$ is allowed to undercut the ends of the laser stripe. The <111> face of the silicon crystal 10 etches very slowly as compared with other faces. The undercutting at the <111> face therefore takes place at a rapid rate. This is illustrated in FIG. 3. Also illustrated is the fact that the <111> planes intersect the surface of the wafer along a line parallel to the [110] direction. A [110] plane of the GaAs will be normal to the wafer surface and aligned to this [110] direction. Therefore, when the undercutting is complete, the GaAs laser structure 22 projects above the silicon anisotropic etch pit with cantilevered beam portions 22X and 22X' extending from the mesa-like projection. The GaAs cleavage plane of the structure 22 is aligned to the edge of the etch pit [See FIG. 1(g)].

After anisotropic etching, the lasers 22 are ready to be cleaved. The lasers may be individually cleaved using pressure applied by a tweezer or other implement. Alternatively, the lasers may be cleaved using sonic energy, the frequency of which is tuned to the resonant frequency of the cantilevered beam sections 22X and 22X' of the lasers 22. Preferably, for the GaAs materials used herein and the length, etc. of the beam, this frequency is in the 100 Hz to 1000 Hz range. Ultrasonic frequencies may be required for other beam lengths and materials. The energy of the sonic source should be sufficient to over-excite the beams such that the stress at the base of the cantilevered section exceeds the yield strength for the cleavage plane. Preferably, all cantilevered sections of the wafer should have the same length; but slight differences may result in practice. Their resonant frequencies will therefore have a tight frequency distribution. However, the vertical shear or "Q" of the beam is an important parameter. A beam with a high Q will be very sensitive to excitation frequencies precisely at its resonant frequency and will have little sensitivity to other frequencies. Beams with lower Q's are less sensitive to excitation at their resonant frequency and will have sensitivity to frequencies over a broader range about their resonant frequency. High Q's are desirable for breaking the beams, since they can more easily be excited into the large amplitude vibrations necessary for cleaving, but are undesirable in that the energy has to be concentrated exactly at the resonant frequency to get them excited at all. Generally, because many beams will be grown on one chip, it may be necessary to scan the sonic energy over the entire range of possible Q distributions. Control over the frequency (jitter) of the sonic energy and the rate of change of frequency during the scan is also an important consideration.

The length and the thickness of the beams is the primary determinant of the resonant frequency for the structure. In order to have predictable results, one should excite the fundamental mode of the beam. A good approximation of this frequency can be obtained from:

$$f_r = .162*(t/l^2)*(E/r)^{178}$$  Equation 1 where
t is the thickness of the beam
l is the length
E is Young's Modulus ($91 \times 10^{12}$ dynes/cm$^2$) and
r is the density of GaAs (5.3 grams/cm$^3$).

Care should be taken to avoid beam breakage during etching. The preferred anisotropic silicon etchant is a liquid. The surface tension of the liquid may cause some of the beams to break as they are withdrawn from the liquid. If the beam happens to break at the base, then this is not a problem. But, if the beam breaks elsewhere, the resonant frequency could be altered dramatically, such that it might not be broken by ultrasonic energy tuned to a different resonant frequency.

Figure 1H:
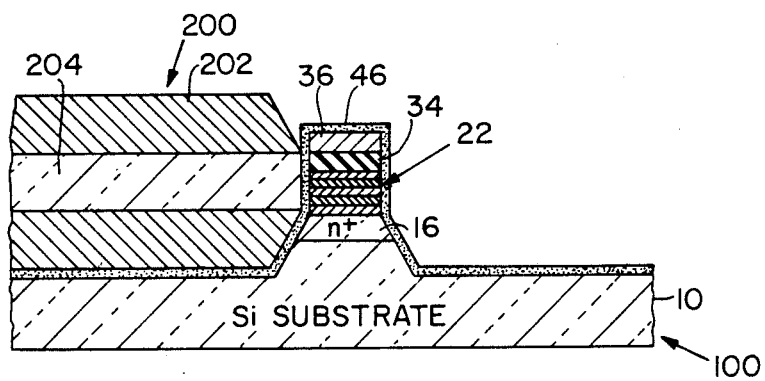

A cross-section of the final cleaved laser is shown in FIG. 1(h). Also shown in section is a fiberoptic device 200 with a central core 204 and coaxial cladding 202 illustrating how readily the fiberoptic structure may be aligned and coupled to the laser device 22.

Figure 5:
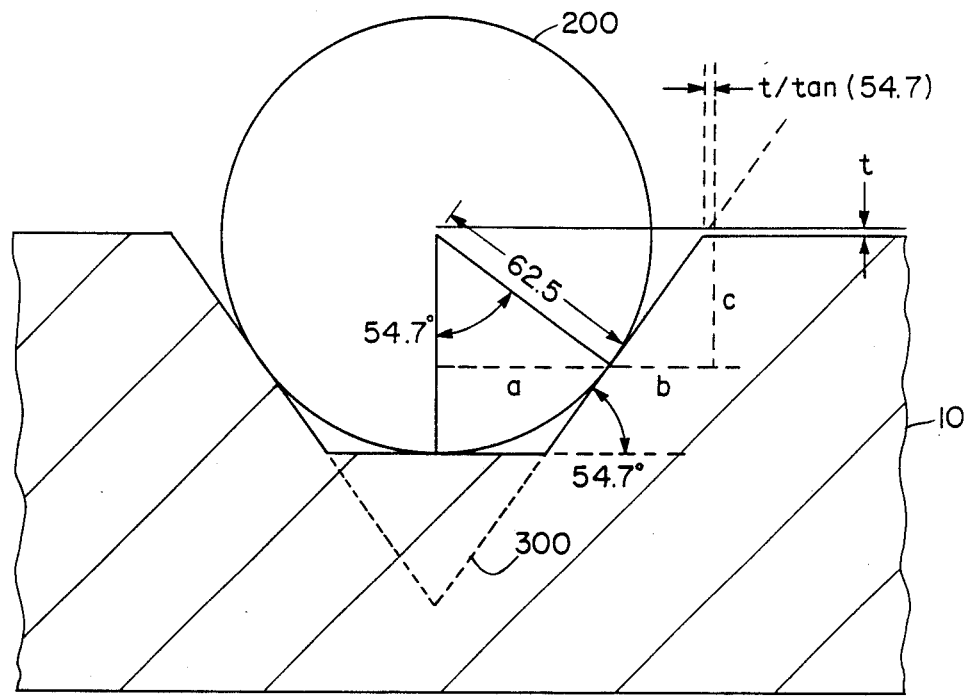
FIG. 5 is a schematic illustration of the fiber 200 bonded to the etched silicon 10.

Typically, the etch grooves are patterned to accommodate a 125 μm optical film. FIG. 5 illustrates some points to be considered in fabricating the etch pattern. The <111> planes of the silicon 10 form an angle of approximately 54° (actually 54.7°) with the surface of the wafer as shown. Since the center of the fiber 200 must align with the surface of the wafer, the etched groove must be 62.5 μm deep. The sidewalls of the etched groove must circumscribe the fiber as shown. A simple calculation indicates that the patterned opening at the wafer surface must be about 174 μm wide. Generally, there is some amount of undercutting during the etching. The relative etch rates for the silicon <100> faces with respect to the silicon <111> faces is about 100:1. Therefore, the channel will be about 1.25 μm wider than shown in FIG. 5. Additionally, the laser output will be emitted from a point approximately 2.5 μm above the surface of the silicon. This means that the channel should be 2.5 μm less than 62.5 μm depth. By another simple calculation, it can be shown that the drawn length would have to be narrowed by an additional 3.5 μm to compensate for the height of the laser. Adding both the undercutting and laser height consideration suggests that the groove width should be about 4 μm smaller than that shown in the figure, or about 170 μm. The dotted line 300 indicates that the depth of the etch is non-critical. The fiber 200 may be bonded in place by an epoxy coating (not shown).

Once cleaved, the mirror faces of the laser should be passivated by a coating layer 36 to reduce degradation. Ideally, this passivation layer could double as an optical coating to enhance the reflection at the laser facets. $Si_2N_4$, $SiO_2$, $Al_2O_3$, $MgF_2$, ZnS or ZnSe may be useful coatings for this process. A conformal coating process, such as PECVD, may be used to coat both facets of the lasers evenly. It may also be appropriate to adjust the reflectivity of the end of the laser facing the fiber 200 such that the reflectivity of that facet is slightly less than that of the opposing facet. In this way, the amount of laser energy coupled to the fiber optic can be optimized.

A final photolithographic step opens holes in the passivation layer 36 permitting contacts 42, 44, 48 to be applied to the metallization 34 at appropriate points coupled to electrodes A, B and C, respectively.

Figure 2:
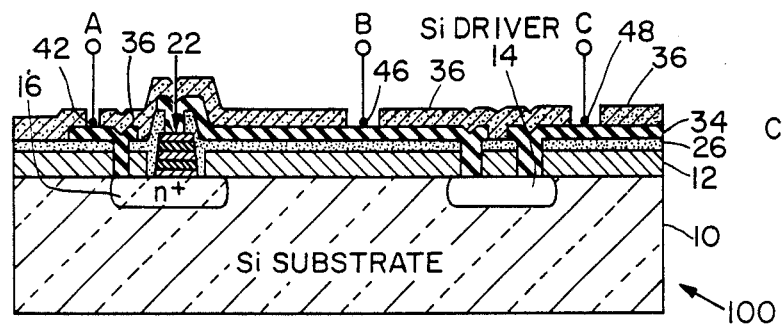
FIG. 2 is a schematic cross-sectional illustration of the invention after completion of the process steps.

FIG. 5 shows the equivalent electrical circuit for the chip 100 of FIG. 2 with the grounded laser 22 connected to the output of the Si driver circuit 14.

EQUIVALENTS

While the above-described embodiments of the invention are preferred, other configurations will be readily apparent to those skilled in the art and thus the invention is only to be limited in scope by the language of the following claims and equivalents. For example, the term Si substrate or wafer is intended to include an SOS (Silicon on Sapphire) substrate, or a Silicon on Insulator (Si on $SiO_2$ on Si) substrate. In addition to lasers; LED's or other optoelectronic devices may be fabricated, such as light detectors. Other type Si devices, such as modulation doped FETs (MODFETs) may be used for the Si driver MESFETs. The lasers may be formed with quantum wells, quaternary layers, buried double heterostructures or other type laser construction. The facets may be formed by etching or mass transport in place of cleaving. The order of processing may be altered so that the III-V optical devices may be formed on the Si substrate before the Si devices. The III-V devices are formed up to the point at which the cantilevered beams are fabricated. A protective coating is formed over the III-V devices while the Si devices are formed by low temperature techniques. Then the coating is removed and the Si etched to produce the cantilevered structure which is removed, as above, to produce the mirror facets.

Finally, the invention may find application in any III-V light-emitting devices formed on silicon, over and above its utility in Si and III-V integrated structures on Si.

What is claimed is:

1. A method of fabricating compound semiconductor devices of III-V or II-VI material on a semiconductor substrate comprising the steps of:
   (a) forming layers of said compound semiconductor over selected regions of the substrate to form said optoelectronic compound semiconductor devices with one of said layers being a light emitting layer;
   (b) forming contact metallization on said devices;
   (c) removing regions of the substrate adjacent to and underlying portions of the compound semiconductor devices leaving the compound semiconductor devices isolated from the substrate on lateral sides with two cantilevered beam sections of compound semiconductor devices extending in opposite directions; and (d) separating the cantilevered sections from the compound semiconductor devices to provide end facets for the compound semiconductor devices.

2. The method of claim 1 wherein the cantilevered sections are separated by sonic energy.

3. The method of claim 1 wherein the substrate comprises silicon, or silicon-on-sapphire, or silicon-on-insulator.

4. The method of claim 1 wherein the layers comprise GaAs.

5. The method of claim 1 wherein the compound semiconductor device is a laser.

6. The method of claim 1 wherein the compound semiconductor is GaAs or an alloy thereof.

7. The method of claim 1 wherein Si devices are also formed on said substrate and such Si devices are driver circuits and the compound semiconductor devices are lasers which are caused to lase by current from said driver circuits.

8. A method of fabricating compound semiconductor devices of III-V or II-VI material and semiconductor devices of silicon on a common substrate comprising the steps of:
   (a) forming Si electronic devices on selected areas of said substrate;
   (b) forming a mask layer over the Si devices and the selected regions;
   (c) forming openings through said mask layer to expose said selected regions;
   (d) forming layers of said compound semi-conductor over at least the exposed selected regions which layers are single crystalline and form optoelectronic compound semiconductor devices with a lasing layer;
   (e) forming contact metallization on said devices;
   (f) removing regions of silicon adjacent and underlying portions of the compound semiconductor devices leaving the compound semiconductor devices isolated from silicon on lateral sides with two cantilevered beam sections of compound semiconductor devices extending in opposite directions; and
   (g) separating the cantilevered sections from the compound semiconductor devices to provide end facets for the compound semiconductor devices.

9. The method of claim 8 wherein the cantilevered sections are separated by sonic energy.

10. The method of claim 8 wherein the substrate comprises silicon, or silicon-on-sapphire, or silicon-on-insulator.

11. The method of claim 8 wherein the mask layer comprises a layer of $Si_3N_4$.

12. The method of claim 8 wherein the compound semiconductor device is a laser.

13. The method of claim 8 wherein the compound semiconductor is GaAs or an alloy thereof.

14. The method of claim 9 wherein the energy is in the ultrasonic range.

15. The method of claim 8 wherein such Si devices are driver circuits and the compound semiconductor devices are lasers which are caused to lase by current from said driver circuits.

16. The method of claim 8 wherein the Si devices are formed of transistors from the class comprising MESFETs, bipolar transistors, or modulation doped FETs.

17. The method of claim 8 wherein the doped regions are n-type.

18. The method of claim 8 wherein the compound semiconductor devices are part of a circuit consisting of transistors and optoelectronic devices.

19. A method of fabricating optical semiconductor devices of gallium arsenide and electronic semiconductor devices of silicon on a common substrate surface comprising the steps of:
   (b) forming silicon devices on selected regions of said surface;
   (c) forming a mask layer over said silicon devices and adjacent regions of said substrate;
   (d) forming openings through said mask layer to expose at least a portion of said adjacent regions;
   (e) forming gallium arsenide optical semiconductor devices in said openings;
   (f) forming contact metallization to said Si devices and GaAs devices;
   (g) isolating the GaAs devices by removing silicon from lateral sides of the GaAs devices and beneath two sides of the GaAs devices to form a main body leaving cantilevered beams of GaAs material extending from said body in opposite directions; and
   (h) removing said beams where they join the main body of the GaAs devices to form end facets for the GaAs devices.

20. The method of claim 19 wherein the metallization is aluminum.

21. The method of claim 19 wherein the mask layer comprises a layer of $Si_3N_4$.

22. The method of claim 19 wherein the mask layer comprises $SiO_2$ and $Si_3N_4$.

23. The method of claim 19 wherein the cantilevered beams are sonically cleaved to remove them.

24. The method of claim 19 wherein the silicon is removed by preferential etching.

25. The method of claim 24 wherein the etchant is a wet etch of hot KOH.

26. The method of claim 24 wherein the etchant is heated hydrazine and $H_2O$.

27. The method of fabricating compound semiconductor devices of III-V or II-VI material and semiconductor devices of silicon on a common substrate with metallized interconnections between the compound semiconductor devices and the silicon devices comprising the steps of:
   (a) forming Si devices on selected areas of a planar surface of said substrate;
   (b) forming a mask layer over the Si devices and adjacent regions;
   (c) forming openings through said mask layer to expose said adjacent regions;
   (d) forming compound semiconductor devices in said openings;
   (e) forming metal interconnections between said Si devices and said compound semiconductor devices;
   (f) removing Si material from all lateral sides and beneath opposite sides of said compound semiconductor devices to leave compound semiconductor material beams extending on opposite sides of said compound semiconductor devices; and
   (g) removing said beams to form end facets for said compound semiconductor devices.

* * * * *

UNITED STATES PATENT AND TRADEMARK OFFICE
CERTIFICATE OF CORRECTION

PATENT NO. : 4,940,672

DATED : July 10, 1990

INVENTOR(S) : Paul M. Zavracky

It is certified that error appears in the above-identified patent and that said Letters Patent is hereby corrected as shown below:

Col. 7, line 2, delete "scmiconductor" and insert ---semiconductor---.

Signed and Sealed this

Twenty-fourth Day of September, 1991

Attest:

HARRY F. MANBECK, JR.

Attesting Officer

Commissioner of Patents and Trademarks